United States Patent
McMackin et al.

(10) Patent No.: US 7,270,533 B2
(45) Date of Patent: *Sep. 18, 2007

(54) SYSTEM FOR CREATING A TURBULENT FLOW OF FLUID BETWEEN A MOLD AND A SUBSTRATE

(75) Inventors: Ian M. McMackin, Austin, TX (US); Nicholas A. Stacey, Austin, TX (US); Daniel A. Babbs, Austin, TX (US); Duane J. Voth, Austin, TX (US); Mathew P. C. Watts, Austin, TX (US); Van N. Truskett, Austin, TX (US); Frank Y. Xu, Austin, TX (US); Ronald D. Voisin, Austin, TX (US); Pankaj B. Lad, Austin, TX (US)

(73) Assignees: University of Texas System, Board of Regents, Austin, TX (US); Molecular Imprints, Inc., Austin, TX (US)

( * ) Notice: Subject to any disclaimer, the term of this patent is extended or adjusted under 35 U.S.C. 154(b) by 384 days.

This patent is subject to a terminal disclaimer.

(21) Appl. No.: 10/898,037

(22) Filed: Jul. 23, 2004

(65) Prior Publication Data
US 2005/0074512 A1    Apr. 7, 2005

Related U.S. Application Data

(62) Division of application No. 10/677,639, filed on Oct. 2, 2003, now Pat. No. 7,090,716.

(51) Int. Cl.
*B29C 59/00* (2006.01)

(52) U.S. Cl. ............ 425/387.1; 425/385; 425/405.1

(58) Field of Classification Search ........... 425/385, 425/387.1, 405.1
See application file for complete search history.

(56) References Cited

U.S. PATENT DOCUMENTS
3,997,447 A    12/1976    Breton et al.

(Continued)

FOREIGN PATENT DOCUMENTS
JP    1-196749    8/1989

(Continued)

OTHER PUBLICATIONS

Feynman, There's Plenty of Room at the Bottom, Dec. 1, 1959.

(Continued)

*Primary Examiner*—Duane Smith
*Assistant Examiner*—Emmanuel S Luk
(74) *Attorney, Agent, or Firm*—Kelly K. Kordzik; Fish & Richardson P.C.

(57) ABSTRACT

The present invention is directed toward a system for introducing a flow of a fluid between a mold, disposed on a template, and a substrate, the system including, a fluid supply system; and a chuck body having a baffle and first and second apertures, the first and second apertures disposed between the baffle and the template, with the first and second apertures in fluid communication with the fluid supply system to produce a turbulent flow of the fluid between the mold and said substrate.

27 Claims, 5 Drawing Sheets

U.S. PATENT DOCUMENTS

| | | | |
|---|---|---|---|
| 4,279,628 | A | 7/1981 | Wymer et al. |
| 4,512,848 | A | 4/1985 | Deckman et al. |
| 4,521,175 | A * | 6/1985 | Medwed ............... 425/403 |
| 4,689,004 | A * | 8/1987 | Kunkel ................ 425/407 |
| 4,731,155 | A | 3/1988 | Napoli et al. |
| 4,767,584 | A * | 8/1988 | Siler .................... 264/78 |
| 5,028,366 | A | 7/1991 | Harakal et al. |
| 5,259,926 | A | 11/1993 | Kuwabara et al. |
| 5,338,177 | A * | 8/1994 | Le Touche ............ 425/384 |
| 5,425,848 | A | 6/1995 | Haisma et al. |
| 5,512,131 | A | 4/1996 | Kumar et al. |
| 5,545,367 | A | 8/1996 | Bae et al. |
| 5,601,641 | A | 2/1997 | Stephens |
| 5,669,303 | A | 9/1997 | Maracas et al. |
| 5,772,905 | A | 6/1998 | Chou |
| 5,776,748 | A | 7/1998 | Singhvi et al. |
| 5,820,769 | A | 10/1998 | Chou |
| 5,821,175 | A | 10/1998 | Engelsberg |
| 5,849,209 | A | 12/1998 | Kindt-Larsen et al. |
| 5,849,222 | A | 12/1998 | Jen et al. |
| 5,948,470 | A | 9/1999 | Harrison et al. |
| 5,956,216 | A | 9/1999 | Chou |
| 6,099,771 | A * | 8/2000 | Hudkins et al. ............ 264/102 |
| 6,159,400 | A | 12/2000 | Laquer |
| 6,218,316 | B1 | 4/2001 | Marsh |
| 6,257,866 | B1 * | 7/2001 | Fritz et al. ............ 425/387.1 |
| 6,309,580 | B1 | 10/2001 | Chou |
| 6,334,960 | B1 | 1/2002 | Willson et al. |
| 6,355,198 | B1 | 3/2002 | Kim et al. |
| 6,391,217 | B2 | 5/2002 | Schaffer et al. |
| 6,416,311 | B1 * | 7/2002 | Springer et al. ............ 425/385 |
| 6,461,524 | B1 | 10/2002 | Tsuihiji et al. |
| 6,482,742 | B1 | 11/2002 | Chou |
| 6,517,995 | B1 | 2/2003 | Jacobenson et al. |
| 6,518,189 | B1 | 2/2003 | Chou |
| 6,580,172 | B2 | 6/2003 | Mancini et al. |
| 6,646,662 | B1 | 11/2003 | Nebashi et al. |
| 6,696,220 | B2 | 2/2004 | Bailey et al. |
| 6,713,238 | B1 | 3/2004 | Chou et al. |
| 6,776,094 | B1 | 8/2004 | Whitesides et al. |
| 6,809,356 | B2 | 10/2004 | Chou |
| 6,828,244 | B2 | 12/2004 | Chou |
| 6,849,558 | B2 | 2/2005 | Schaper |
| 6,900,881 | B2 | 5/2005 | Sreenivasan et al. |
| 6,908,861 | B2 | 6/2005 | Sreenivasan et al. |
| 6,916,584 | B2 | 7/2005 | Sreenivasan et al. |
| 6,932,934 | B2 | 8/2005 | Choi et al. |
| 6,982,783 | B2 * | 1/2006 | Choi et al. ................ 355/72 |
| 7,019,819 | B2 * | 3/2006 | Choi et al. ................ 355/75 |
| 2002/0018190 | A1 | 2/2002 | Nogawa et al. |
| 2002/0042027 | A1 | 4/2002 | Chou et al. |
| 2002/0132482 | A1 | 9/2002 | Chou |
| 2002/0167117 | A1 | 11/2002 | Chou |
| 2002/0177319 | A1 | 11/2002 | Chou |
| 2003/0034329 | A1 | 2/2003 | Chou |
| 2003/0062334 | A1 | 4/2003 | Lee et al. |
| 2003/0080471 | A1 | 5/2003 | Chou |
| 2003/0080472 | A1 | 5/2003 | Chou |
| 2004/0007799 | A1 | 1/2004 | Choi et al. |
| 2004/0008334 | A1 | 1/2004 | Sreenivasan et al. |
| 2004/0009673 | A1 | 1/2004 | Sreenivasan et al. |
| 2004/0021254 | A1 | 2/2004 | Sreenivasan et al. |
| 2004/0021866 | A1 | 2/2004 | Watts et al. |
| 2004/0022888 | A1 | 2/2004 | Sreenivasan et al. |
| 2004/0036201 | A1 | 2/2004 | Chou et al. |
| 2004/0046288 | A1 | 3/2004 | Chou |
| 2004/0110856 | A1 | 6/2004 | Young et al. |
| 2004/0118809 | A1 | 6/2004 | Chou et al. |
| 2004/0123293 | A1 | 7/2004 | Eichenberger |
| 2004/0124566 | A1 | 7/2004 | Sreenivasan et al. |
| 2004/0131718 | A1 | 7/2004 | Chou et al. |
| 2004/0137734 | A1 | 7/2004 | Chou et al. |
| 2004/0156108 | A1 | 8/2004 | Chou et al. |
| 2004/0192041 | A1 | 9/2004 | Jeong et al. |
| 2004/0197843 | A1 | 10/2004 | Chou et al. |
| 2004/0250945 | A1 | 12/2004 | Zheng et al. |
| 2005/0037143 | A1 | 2/2005 | Chou et al. |
| 2005/0072755 | A1 | 4/2005 | McMackin et al. |
| 2005/0074512 | A1 | 4/2005 | McMackin et al. |

FOREIGN PATENT DOCUMENTS

| | | |
|---|---|---|
| JP | 02-24848 | 1/1990 |
| JP | 02-92603 | 4/1990 |
| JP | 02192045 | 7/1990 |
| WO | WO87/02935 | 5/1987 |
| WO | WO99/05724 | 2/1999 |
| WO | WO 00/21689 | 4/2000 |
| WO | WO 01/47003 | 6/2001 |
| WO | WO 02/07199 | 1/2002 |
| WO | WO 03/010289 | 2/2003 |
| WO | WO 03/079416 | 9/2003 |
| WO | WO 03/099536 | 12/2003 |
| WO | WO 2004/114016 | 12/2004 |

OTHER PUBLICATIONS

Xia et al., Soft Lithography, Angew. Chem. Int. Ed., pp. 550-575 Jan. 1, 1998.

Nguyen, Asymmetric Fluid-Structure Dynamics in Nanoscale Imprint Lithography, The University of Texas at Austin, pp. 1-111 Aug. 1, 2001.

Abstract of Japanese Patent 02-92603, Aug. 12, 2004.

Abstract of Japanese Patent 02-24848, Jan. 26, 1990.

U.S. Appl. No. 11/126,946, naming Inventors Choi et al., entitled Formation of Discontinuous Films During an Imprint Lithography Process, filed May 11, 2005.

U.S. Appl. No. 11/127,041, naming Inventors Sreenivasan et al., entitled Step and Repeat Imprint Lithography Processes, filed May 11, 2005.

U.S. Appl. No. 11/127,060, naming Inventors Sreenivasan et al., entitled Step and Repeat Imprint Lithography Systems, filed May 11, 2005.

Fuchs et al., Large Scale Homogeneity of UV based Nanoimprint, First International Conference on NNT 2002, San Francisco/USA Dec. 11, 2002.

Nordquist et al., Image Placement Issues for ITO-based Step and Flash Imprint Lithography Templates, J. Vac. Sci. Technol. B, pp. 695-701 Mar. 1, 2004.

U.S. Appl. No. 10/898,034, filed Jul. 23, 2004, McMackin et al.

U.S. Appl. No. 10/677,639, filed Oct. 16, 2003, McMackin et al.

Chou, Nanoimprint Lithography and Lithographically Induced Self-Assembly, MRS Bulletin, pp. 512-517, Jul. 1, 2001.

Choi et al., Design of Orientation Stages for Step and Flash Imprint Lithography, Precision Engineering, pp. 192-199, Jan. 1, 2001.

Colburn et al., Step and Flash Imprint Lithography for sub-100 nm Patterning, Proceedings of SPIE vol. 3997, pp. 453-457, Jan. 1, 2000.

Chou et al., Imprint Lithography with 25-Nanometer Resolution, Science vol. 272, pp. 85-87, Apr. 5, 1996.

Chou et al., Imprint Lithography with Sub-10 nm Feature Size and High Throughput, Microelectronic Engineering 35, pp. 237-240, Jan. 1, 1997.

Haisma et al., Mold-assisted Nanolithography: A Process for Reliable Pattern Replication, J. Vac. Sci. Technol. B, pp. 4124-4128, Nov. 1, 1996.

Chou et al., Imprint of Sub-25 nm Vias and Trenches in Polymers, Appl. Phys. Lett. 67 (21), Nov. 20, 1995.

Johnson et al., Advances in Step and Flash Imprint Lithography, SPIE Microlithography Conference, Feb. 23, 2003.

Chou et al., Lithographically Induced Self-assembly of Periodic Polymer Micropillar Arrays, J. Vac. Sci. Technol. B 17 (6), pp. 3197-3202, Nov. 1, 1999.

Colburn et al., Step and Flash Imprint Lithography: A New Approach to High-Resolution Patterning, Proc. Of SPIE, vol. 3676, Mar. 1, 1999.

Heidari, Nanoimprint Lithography at the 6 in. Wafer Scale, J. Vac. Sci. Technol. B 18(6), pp. 3557-3560, Nov. 1, 2000.

Translation of Japanese Patent 02-92603.

Translation of Japanese Patent 02-24848.

Chou et al., Ultrafast and Direct Imprint of Nanostructures in Silicon, Nature, Col. 417, (Jun. 2002), pp. 835-837, Jun. 1, 2002.

Chou et al., Nanoimprint Lithography, Journal of Vacuum Science Technologoy B 14(16), pp. 4129-4133, Nov. 1, 1996.

Colburn et al., Development and Advantages of Step-and-Flash Lithography, Solid State Technology, Jul. 1, 2001.

Colburn et al., Characterization and Modeling of Volumetric and Mechanical Properties for Step and Flash Imprint Lithography Photopolymers, Journal of Vacuum Science Technology. vol. b. 19(6), Nov. 1, 2001.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Schneider et al., Stripes of Partially Fluorinated Alkyl Chains: Dipolar Langmuir Monolayers.

* cited by examiner

continues on next page …

SYSTEM FOR CREATING A TURBULENT FLOW OF FLUID BETWEEN A MOLD AND A SUBSTRATE

CROSS-REFERENCE TO RELATED APPLICATIONS

The present application is a divisional, and claims priority from, U.S. patent application Ser. No. 10/677,639 filed on Oct. 2, 2003, now U.S. Pat. No. 7,090,716 entitled "Single Phase Fluid Imprint Lithography Method," which is incorporated by reference herein.

BACKGROUND OF THE INVENTION

The field of invention relates generally to imprint lithography. More particularly, the present invention is directed to a system for controlling a flow of a substance over an imprinting material.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The transfer layer and the solidified polymeric material are subjected to an environment to selectively etch the transfer layer relative to the solidified polymeric material such that a relief image is formed in the transfer layer. The time required and the minimum feature dimension provided by this technique is dependent upon, inter alia, the composition of the polymerizable material.

U.S. Pat. No. 5,772,905 to Chou discloses a lithographic method and apparatus for creating ultra-fine (sub-25 nm) patterns in a thin film coated on a substrate in which a mold having at least one protruding feature is pressed into a thin film carried on a substrate. The protruding feature in the mold creates a recess of the thin film. The mold is removed from the film. The thin film then is processed such that the thin film in the recess is removed, exposing the underlying substrate. Thus, patterns in the mold are replaced in the thin film, completing the lithography. The patterns in the thin film will be, in subsequent processes, reproduced in the substrate or in another material which is added onto the substrate.

Yet another imprint lithography technique is disclosed by Chou et al. in *Ultrafast and Direct Imprint of Nanostructures in Silicon*, Nature, Col. 417, pp. 835–837, June 2002, which is referred to as a laser assisted direct imprinting (LADI) process. In this process. a region of a substrate is made flowable, e.g., liquefied, by heating the region with the laser. After the region has reached a desired viscosity, a mold, having a pattern thereon, is placed in contact with the region. The flowable region conforms to the profile of the pattern and is then cooled, solidifying the pattern into the substrate. A concern with this technique involves pattern distortions attributable to the presence of gases in the flowable region.

It is desired, therefore, to provide a system to reduce distortions in patterns formed using imprint lithographic techniques.

SUMMARY OF THE INVENTION

The present invention is directed toward a system for introducing a flow of a fluid between a mold, disposed on a template, and a substrate, the system including, a fluid supply system; and a chuck body having a baffle and first and second apertures, the first and second apertures disposed between the baffle and the template, with the first and second apertures in fluid communication with the fluid supply system to produce a turbulent flow of the fluid between the mold and said substrate. These and other embodiments are discussed more fully below.

DETAILED DESCRIPTION OF THE INVENTION

Figure 1:
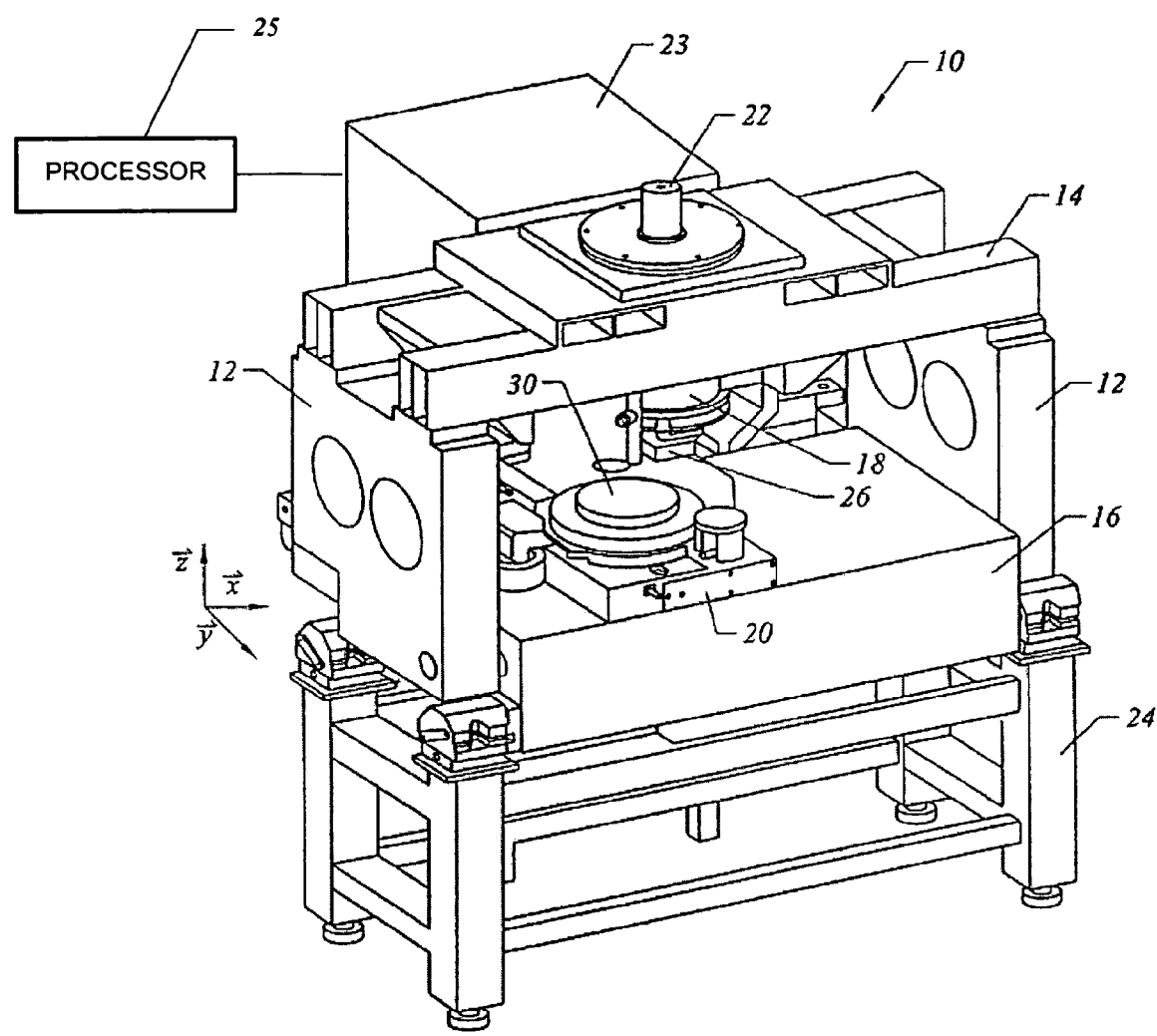
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16 and provides movement along the Z-axis.

Disposed upon stage support 16 to face imprint head 18 is a motion stage 20. Motion stage 20 is configured to move with respect to stage support 16 along X- and Y-axes. It should be understood that imprint head 18 may provide movement along the X- and Y-axes, as well as in the Z-axis, and motion stage 20 may provide movement in the Z-axis, as well as in the X and Y axes. An exemplary motion stage device is disclosed in U.S. patent application Ser. No. 10/194,414, filed Jul. 11, 2002, entitled "Step and Repeat Imprint Lithography Systems," assigned to the assignee of the present invention, and which is incorporated by reference herein in its entirety. A radiation source 22 is coupled to lithographic system 10 to impinge actinic radiation upon motion stage 20. As shown, radiation source 22 is coupled to bridge 14 and includes a power generator 23 connected to radiation source 22. Operation of lithographic system 10 is typically controlled by a processor 25 that is in data communication therewith.

Figure 2:
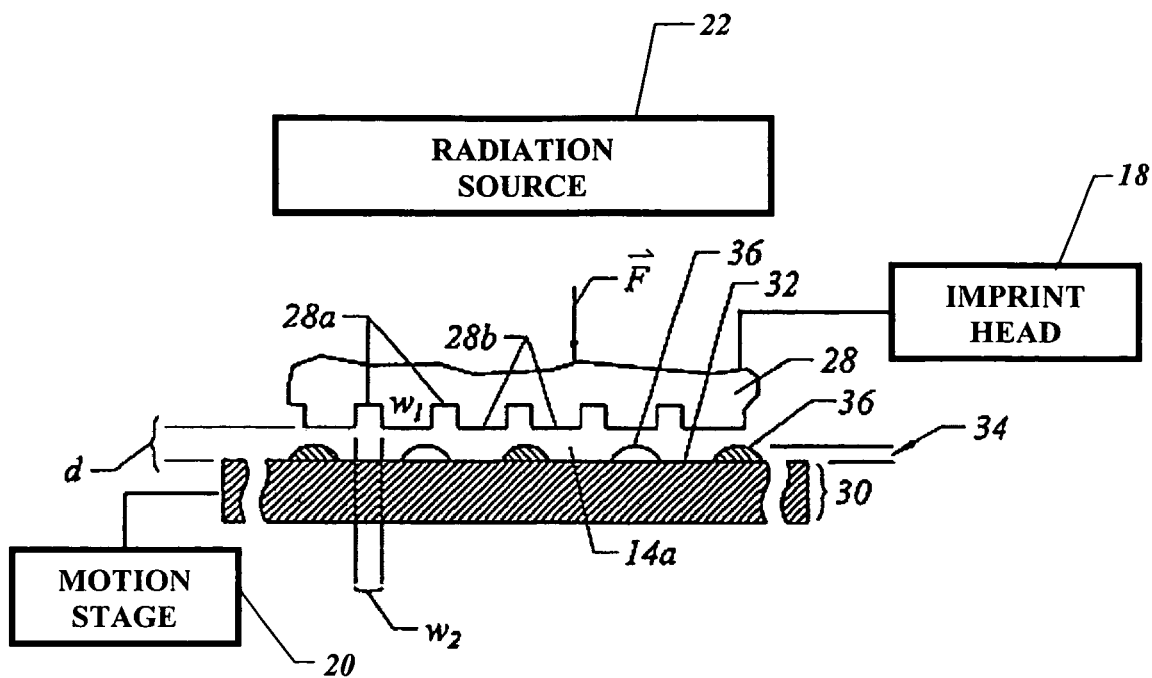
FIG. 2 is a simplified elevation view of a lithographic system shown in FIG. 1.

Referring to both FIGS. 1 and 2, connected to imprint head 18 is a template 26 having a mold 28 thereon. Mold 28 includes a plurality of features defined by a plurality of spaced-apart recessions 28a and protrusions 28b. The plurality of features defines an original pattern that is to be transferred into a substrate 30 positioned on motion stage 20. To that end, imprint head 18 and/or motion stage 20 may vary a distance "d" between mold 28 and substrate 30. In this manner, the features on mold 28 may be imprinted into a flowable region of substrate 30, discussed more fully below. Radiation source 22 is located so that mold 28 is positioned between radiation source 22 and substrate 30. As a result, mold 28 is fabricated from a material that allows it to be substantially transparent to the radiation produced by radiation source 22.

Figure 3:
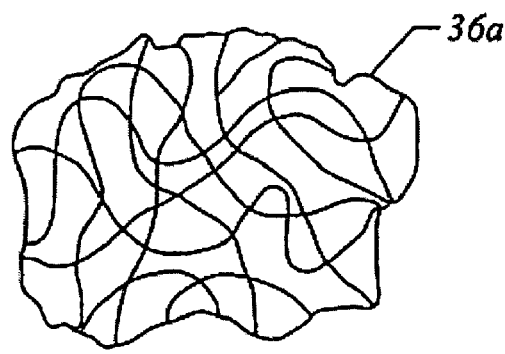
FIG. 3 is a simplified representation of material from which an imprinting layer, shown in FIG. 2, is comprised before being polymerized and cross-linked.

Referring to both FIGS. 2 and 3, a flowable region, such as an imprinting layer 34, is disposed on a portion of a surface 32 that presents a substantially planar profile. A flowable region may be formed using any known technique, such as a hot embossing process disclosed in U.S. Pat. No. 5,772,905, which is incorporated by reference in its entirety herein, or a laser assisted direct imprinting (LADI) process of the type described by Chou et al. in *Ultrafast and Direct Imprint of Nanostructures in Silicon*, Nature, Col. 417, pp. 835–837, June 2002. In the present embodiment, however, a flowable region consists of imprinting layer 34 being deposited as a plurality of spaced-apart discrete droplets 36 of a material 36a on substrate 30, discussed more fully below. An exemplary system for depositing droplets 36 is disclosed in U.S. patent application Ser. No. 10/191,749, filed Jul. 9, 2002, entitled "System and Method for Dispensing Liquids," assigned to the assignee of the present invention, and which is incorporated by reference herein in its entirety. Imprinting layer 34 is formed from material 36a that may be selectively polymerized and cross-linked to record the original pattern therein, defining a recorded pattern. An exemplary composition for material 36a is disclosed in U.S. patent application Ser. No. 10/463,396, filed Jun. 16, 2003, and entitled "Method to Reduce Adhesion Between a Conformable Region and a Pattern of a Mold," which is incorporated by reference in its entirety herein. Material 36a is shown in FIG. 4 as being cross-linked at points 36b, forming a cross-linked polymer material 36c.

Figure 5:
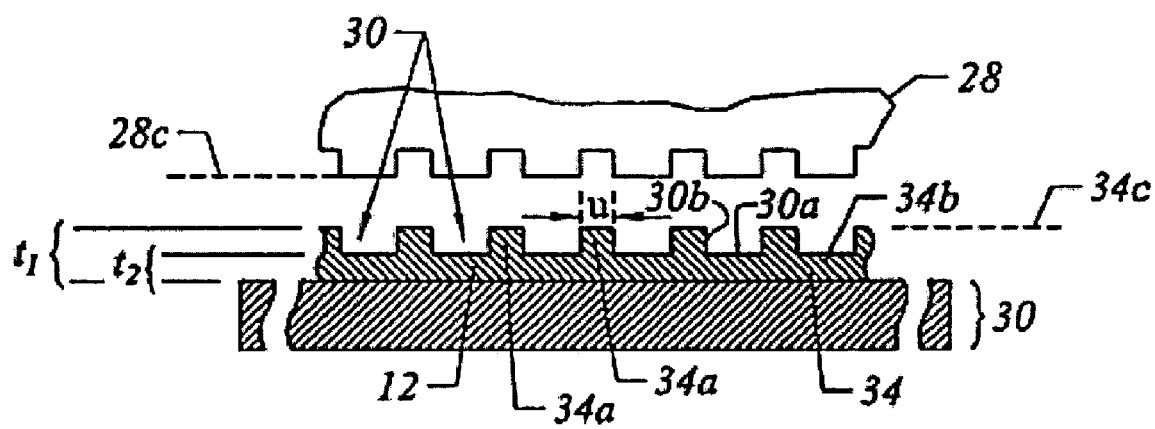
FIG. 5 is a simplified elevation view of a mold spaced-apart from the imprinting layer, shown in FIG. 1, after patterning of the imprinting layer.

Referring to FIGS. 2, 3 and 5, the pattern recorded in imprinting layer 34 is produced, in part, by mechanical contact with mold 28. To that end, distance "d" is reduced to allow droplets 36 to come into mechanical contact with mold 28, spreading droplets 36 so as to form imprinting layer 34 with a contiguous formation of material 36a over surface 32. In one embodiment, distance "d" is reduced to allow sub-portions 34a of imprinting layer 34 to ingress into and fill recessions 28a.

To facilitate filling of recessions 28a, material 36a is provided with the requisite properties to completely fill recessions 28a, while covering surface 32 with a contiguous formation of material 36a. In the present embodiment, sub-portions 34b of imprinting layer 34 in superimposition with protrusions 28b remain after the desired, usually minimum, distance "d" has been reached, leaving sub-portions 34a with a thickness $t_1$, and sub-portions 34b with a thickness, $t_2$. Thicknesses "$t_1$" and "$t_2$" may be any thickness desired, dependent upon the application. Typically, $t_1$ is selected so as to be no greater than twice the width u of sub-portions 34a, i.e., $t_1 \leq 2u$, shown more clearly in FIG. 5.

Figure 4:
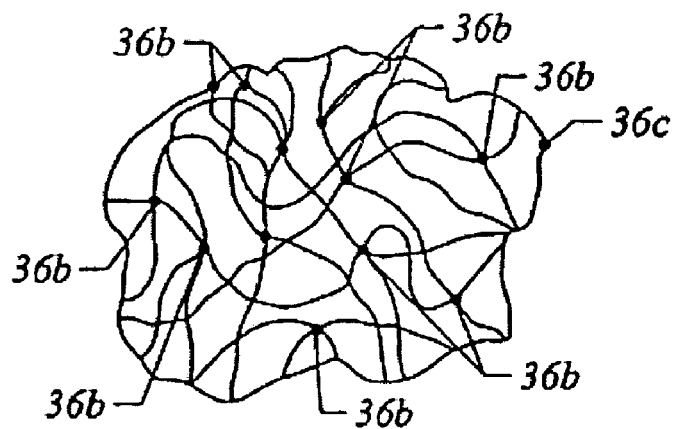
FIG. 4 is a simplified representation of cross-linked polymer material into which the material shown in FIG. 3 is transformed after being subjected to radiation.

Referring to FIGS. 2, 3 and 4, after a desired distance "d" has been reached, radiation source 22 produces actinic radiation that polymerizes and cross-links material 36a, forming cross-linked polymer material 36c. As a result, the composition of imprinting layer 34 transforms from material 36a to cross-linked polymer material 36c, which is a solid. Specifically, cross-linked polymer material 36c is solidified to provide side 34c of imprinting layer 34 with a shape conforming to a shape of a surface 28c of mold 28, shown more clearly in FIG. 5. After imprinting layer 34 is transformed to consist of cross-linked polymer material 36c, shown in FIG. 4, imprint head 18, shown in FIG. 2, is moved to increase distance "d" so that mold 28 and imprinting layer 34 are spaced-apart.

Figure 6:
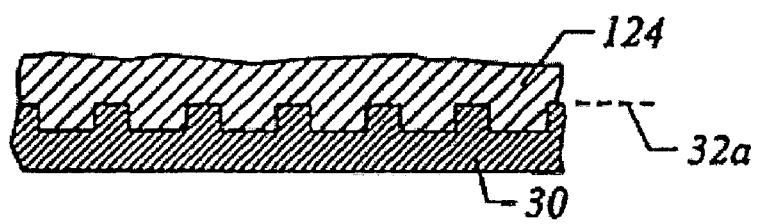
FIG. 6 is a simplified elevation view of an additional imprinting layer positioned atop the substrate shown in FIG. 5 after the pattern in the first imprinting layer is transferred therein.

Referring to FIG. 5, additional processing may be employed to complete the patterning of substrate 30. For example, substrate 30 and imprinting layer 34 may be etched to transfer the pattern of imprinting layer 34 into substrate 30, providing a patterned surface 32a, shown in FIG. 6. To facilitate etching, the material from which imprinting layer 34 is formed may be varied to define a relative etch rate with respect to substrate 30, as desired. The relative etch rate of imprinting layer 34 to substrate 30 may be in a range of about 1.5:1 to about 100:1.

Alternatively, or in addition to, imprinting layer 34 may be provided with an etch differential with respect to photo-resist material (not shown) selectively disposed thereon. The photo-resist material (not shown) may be provided to further pattern imprinting layer 34, using known techniques. Any etch process may be employed, dependent upon the etch rate desired and the underlying constituents that form substrate 30 and imprinting layer 34. Exemplary etch processes may include plasma etching, reactive ion etching, chemical wet etching and the like.

Figure 7:
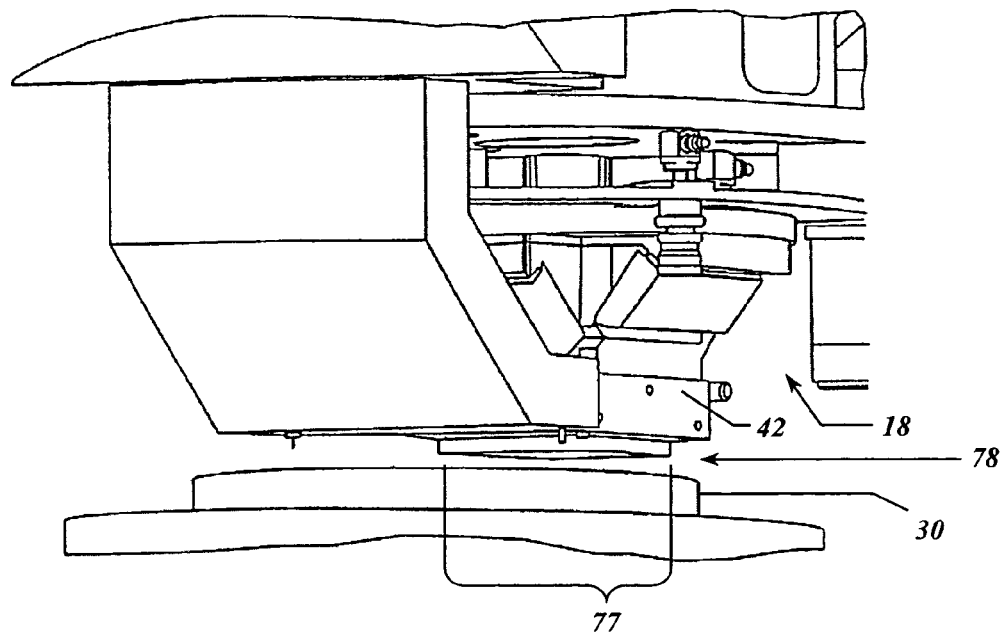
FIG. 7 is a detailed perspective view of a print head shown in FIG. 1.
Figure 8:
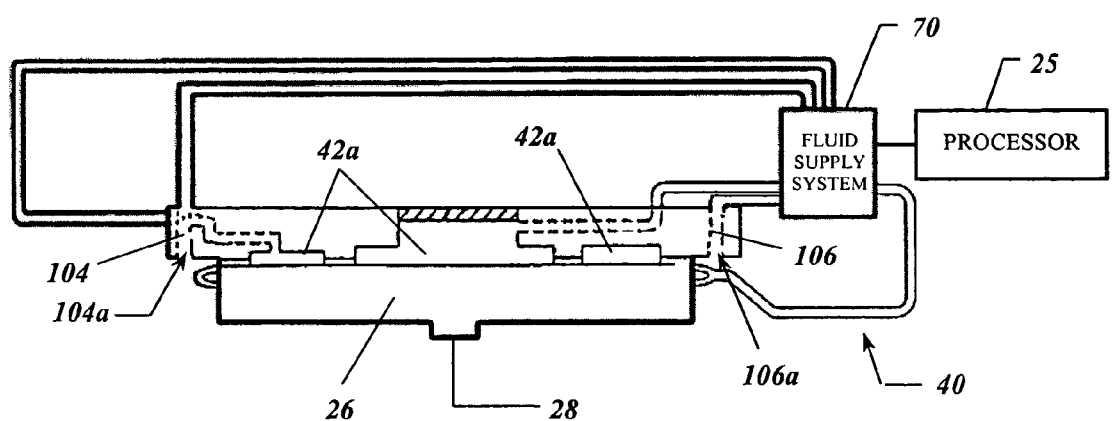
FIG. 8 is a cross-sectional view of a chucking system in accordance with the present invention.

Referring to FIGS. 7 and 8, template 26, upon which mold 28 is present, is coupled to an imprint head housing 18a via a chucking system 40 that includes a chuck body 42. Chuck body 42 is adapted to retain template 26 upon which mold 28 is attached employing vacuum techniques. To that end, chuck body 42 includes one or more recesses 42a that are in fluid communication with a pressure control system, such as a fluid supply system 70. Fluid supply system 70 may include one or more pumps to provide both positive and negative pressure, as well as a supply of fluid to facilitate reducing, if not preventing, trapping of gases, such as air, in imprinting layer 34, shown in FIG. 5. An exemplary chucking system is disclosed in U.S. patent application Ser. No. 10/293,224, entitled "Chucking System For Modulating Shapes of Substrates," assigned to the assignee of the present invention, and which is incorporated by reference in its entirety herein.

As discussed above, during imprinting template 26 and, therefore, mold 28, is brought into proximity with substrate 30 before patterning imprinting material 36a, shown in FIG. 3, is disposed on a region 77 of substrate 30. Specifically, template 26 is brought within microns of substrate 30, e.g., 15 microns more or less. It has been found desirable to perform localized control of the atmosphere 78 that is proximate to both template 26 and region 77. For example, to avoid the deleterious effects of gases present in imprinting material 36a, shown in FIG. 3, and/or subsequently trapped in the patterned imprinting layer 34, shown in FIG. 2, it has been found beneficial to control the consistency of fluid in atmosphere 78 and/or the pressure of atmosphere 78.

Figure 9:
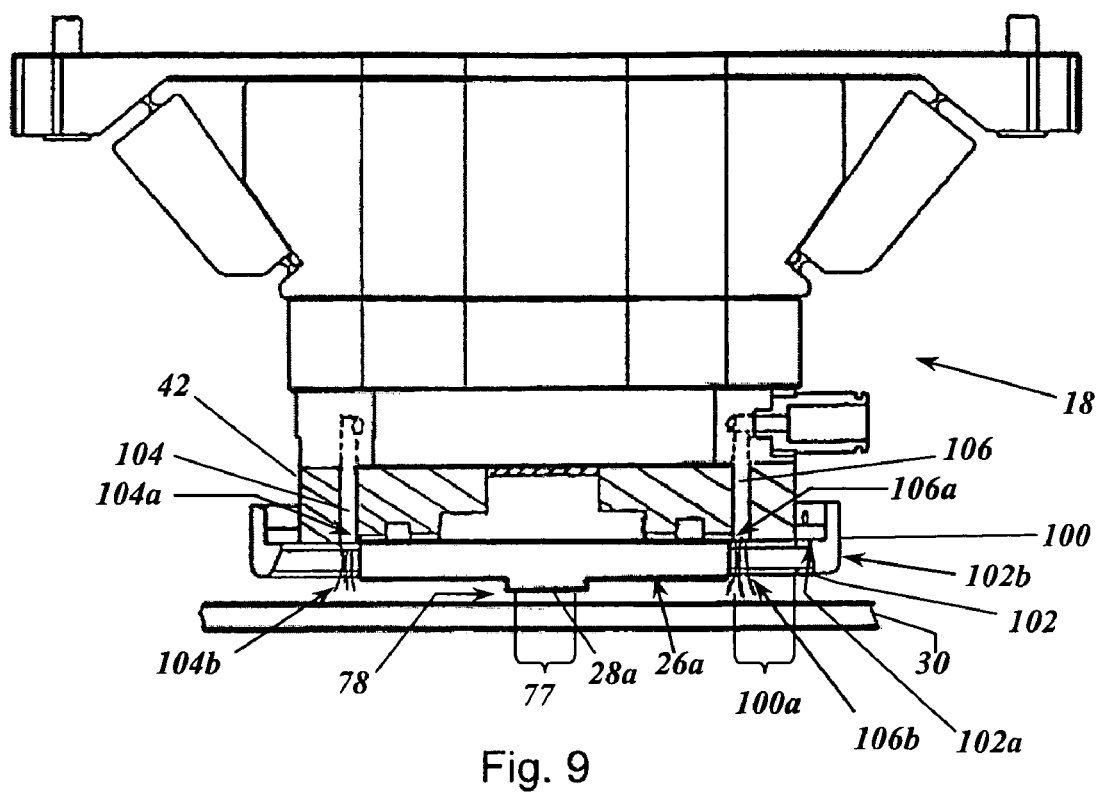
FIG. 9 is detailed cross-sectional view of an imprint head shown in FIG. 7.

Referring to FIG. 9, to facilitate control of atmosphere 78, chuck body 42 is designed to facilitate the passage of fluids proximate to mold 28 and imprint head 18 includes a baffle 100 surrounding template 26. Specifically, baffle 100 extends from imprint head 18, terminating in a nadir 102 that lies in a plane in which a surface 26a lies. In this fashion, mold 28 extends beyond nadir 102 to facilitate contact with region 77. Chuck body 42 includes one or more throughways, two of which are shown as 104 and 106. Apertures 104a and 106a of throughways 104 and 106, respectively, are disposed in a surface of chuck body 42 disposed between template 26 and baffle 100, referred to as a peripheral surface 100a. Throughways 104 and 106 place apertures 104a and 106a in fluid communication with fluid supply system 70, shown in FIG. 8. Baffle 100 functions to slow the movement of fluid exiting apertures 104a and 106a away from mold 28. To that end, baffle 100 includes first and second opposed surfaces 102a and 102b. First opposed surface 102a extends from nadir 102 away from substrate 30 and faces template 26. Second opposed surface 102b extends from nadir 102 away from substrate 30 and faces away from mold 28. Although it is not necessary, first opposed surface 102a is shown extending obliquely with respect to second opposing surface 102b. With this configuration, atmosphere 78 may be controlled by introduction or evacuation of fluid through apertures 104a and 106a. However, first and second opposed surfaces 102a and 102b may extend parallel to one another from nadir 102.

Referring to FIGS. 3, 8 and 9, in one embodiment, atmosphere 78 is established so that the transport of the gases present therein to imprinting material 36a in region 77 is increased. The term transport is defined to mean any mechanism by which the propagation of gases through imprinting material 36a is increased, e.g., increased solubility, increased diffusion and the like. To that end, fluid supply system 70 may include a supply of imprinting material 36a. Under control of processor 25, which is in data communication with fluid supply system 70, imprinting material 36a may be introduced through apertures 104a and 106a to saturate atmosphere 78 with imprinting material 36a. This was found to reduce, if not completely do away with, the quantity of gases, such as air, trapped in the imprinting layer 34, shown in FIG. 5, during imprint processes. This is beneficial as it was found that the presence of air in imprinting layer 34, shown in FIG. 5, creates undesirable voids. Alternatively, it was found that by saturating atmosphere 78 with carbon dioxide and/or helium the quantity of air trapped in imprinting layer 34, shown in FIG. 5, was substantially reduced if not avoided. It should be understood that a mixture of imprinting material 36a, carbon dioxide and/or helium may be introduced into atmosphere 78 to reduce the quantity of air trapped in imprinting layer 34, shown in FIG. 5.

Figure 10:
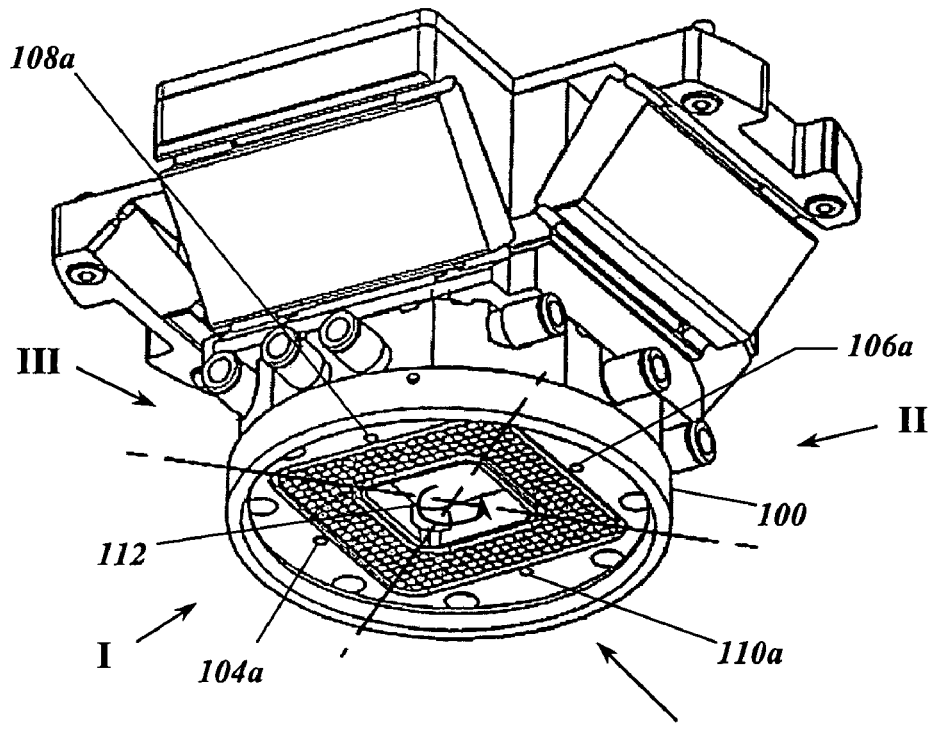
FIG. 10 is a bottom-up perspective view of the imprint head shown in FIG. 9.

Referring to FIGS. 2, 9 and 10, a difficulty encountered with respect to introducing fluids was to ensure that the molecules in the fluid streams 104b and 106b exiting apertures 104a and 106a, respectively, traveled to a region of the atmosphere positioned between mold 28 and droplets 36, and before contact of droplets 36 with mold 28. This region of atmosphere 78 is referred to as a processing region 78a. As shown, apertures 104a and 106a are disposed about peripheral surface 100a, which is spaced-apart from processing region 78a. Given that the separation of mold 28 from region 77 is on the order of microns, the relative dimensions of the molecules in fluid streams 104b and 106b and the spacing between mold 28 and region 77 makes difficult the ingression of the aforementioned molecules into processing region 78a.

Referring to FIGS. 8 and 9, one manner in which to overcome the aforementioned difficulty is to have fluid supply system 70 under control of processor 25. A memory (not shown) is in data communication with processor 25. The memory (not shown) comprises a computer-readable medium having a computer-readable program embodied therein. The computer-readable program includes instructions to pulse fluid streams 104b and 106b into atmosphere 78 having a desired mixture of molecules, discussed above. In this manner, laminar flow of fluid streams 104b and 106b may be avoided. It is believed that by providing fluid streams 104b and 106b with turbulent flow, the probability will be increased that a sufficient quantity of the molecules contained therein will reach processing region 78a to reduce, if not avoid, the presence of gases being trapped in imprinting layer 34. To that end, fluid may be pulsed through both apertures 104a and 106a, concurrently, or sequentially pulsed through the same, i.e., first fluid is introduced through aperture 104a and subsequently through aperture 106a and then again through 104a, with the process being repeated for a desired time or during the entire imprinting process. Furthermore, the timing of the flow of gas into processing region 78a is important because it is desired that a sufficient quantity of molecules contained therein reach processing region 78a before contact is made between mold 28 and droplets 36.

Referring to FIG. 9, alternatively, fluid may be pulsed through one of the apertures, e.g., aperture 104a, and then evacuated through the remaining aperture, e.g., aperture 106a. In this manner, fluid would be drawn across processing region 78a. It may also be advantageous to pulse the fluid through both apertures 104a and 106a, concurrently, then evacuate through both apertures 104a and 106a concurrently. It is desired, however, that the flow rate of fluid be established to minimize, if not avoid, movement of droplets 36, shown in FIG. 2.

To ensure that the fluids exiting apertures 104a and 106a crosses through processing region 78a, it may be advantageous to concurrently pulse fluid through both apertures 104a and 106a concurrently and then alternatingly evacuate through one of apertures 104a or 106a. Concurrently introducing the fluid through both apertures 104a and 106a minimizes the time required to saturate atmosphere 78. Alternatingly evacuating the fluid through one of apertures 104a and 106a ensures that the fluid travels through processing region 78a. For example, a first step would include introducing fluid into atmosphere 78 through both apertures 104a and 106a. A second step would include evacuating the fluid through one of apertures 104a and 106a, e.g., aperture 104a. Thereafter, at a third step, fluid would be introduced into atmosphere 78 through both apertures 104a and 106a, concurrently. At a fourth step, fluid would be evacuated through one of apertures 104a and 106a that was not employed in the previous step to remove fluid, e.g., aperture 106a. It should be understood that evacuation may occur through one of apertures 104a and 106a, while fluid is being introduced through the remaining aperture of apertures 104a and 106a. Alternatively, evacuation may occur in the absence of a fluid flow into atmosphere 78. The desired result is that fluid ingression into atmosphere 78 and fluid evacuation therefrom occurs so that the desired concentration of fluid is present.

Referring to FIGS. 9 and 10, in another embodiment, a plurality of apertures may be disposed about peripheral surface 100a so that each of the apertures of a pair is disposed opposite one another on opposite sides of template 26. This is shown by aperture pair 104a and 106a being disposed opposite one another on opposite sides of template 26. A second aperture pair is shown as 108a and 110a. Apertures 108a and 110a are disposed opposite one another on opposite sides of template 26.

As shown, each of apertures 104a, 106a, 108a and 110a, are arranged to lie on a common circle with adjacent apertures being spaced-apart therefrom by 900. In this manner, each of apertures 104a, 106a, 108a and 110a are arranged to facilitate fluid flow in/out of a different quadrant of chuck body 42. Specifically, aperture 104a facilitates fluid flow in/out of quadrant I; aperture 106a facilitates fluid flow in/out of quadrant II; aperture 108a facilitates fluid flow in/out of quadrant III; and aperture 110a facilitates fluid flow in/out of quadrant IV. However, any number of apertures may be employed, e.g., more than one per quadrant with differing quadrants having differing numbers of apertures and arranged in any spatial arrangement desired. Each of these arrangements should facilitate introduction and/or evacuation of a plurality of flows of fluid streams into atmosphere 78, with a subset of the plurality of flows being introduced to differing regions about template 26. It is believed that introduction of the multiple flows of fluid streams provides a turbulent flow of fluid in atmosphere 78. This, it is believed, increases the probability that molecules in the fluid streams would reach processing region 78a. However, fluid flow into atmosphere 78 through each of the apertures 104a, 106a, 108a and 110a and evacuation of fluid from atmosphere 78 therethrough may occur in any manner discussed above.

In another embodiment, a fluid stream may be introduced through each of apertures 104a, 106a, 108a and 110a sequentially so that a flow cell 112 may be created between template 26 and region 77. Flow cell 112 would facilitate ingression of molecules in the fluid streams into processing region 78a to provide the benefits mentioned above. For example, first a fluid flow may be introduced through aperture 104a and then terminated. After termination of fluid flow through aperture 104a, fluid flow through aperture 106a is commenced to introduce fluid into atmosphere 78. Subsequently, fluid flow through aperture 106a is terminated. After termination of fluid flow through aperture 106a, fluid flow through aperture 108a is commenced to introduce fluid into atmosphere 78. Fluid flow in through aperture 108a is subsequently terminated. After termination of fluid flow through aperture 108a, fluid flow through aperture 110a is commenced to introduce fluid into atmosphere 78. In this manner, fluid is introduced into atmosphere 78 through a single quadrant at any given time. However, it may be desirable to introduce fluid into more than one quadrant. Although this may frustrate creation of flow cell 112, it is within confines of the present invention.

Alternatively, sequential introduction and evacuation through apertures 104a, 106a, 108a and 110a may be undertaken to create flow cell 112. This would include introducing fluid through one or more of apertures 104a, 106a, 108a and 110a, concurrently. Subsequently, sequential evacuation may occur through each of apertures 104a, 106a, 108a and 110a to create flow cell 112. For example, fluid may be introduced through all apertures in chuck body 42, concurrently. Thereafter, fluid may be evacuated from each of apertures 104a, 106a, 108a and 110a, one at a time. Before, the concentration in atmosphere 78 of fluid introduced through apertures 104a, 106a, 108a and 110a went below a desired level due to evacuation. The fluid may then be reintroduced through one or all of apertures 104a, 106a, 108a and 110a again and the process repeated to create and/or maintain flow cell 112.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A system for introducing a flow of a fluid between a mold, disposed on a template, and a substrate, said system comprising:
    a fluid supply system; and
    a chuck body having a baffle and first and second apertures, said first and second apertures disposed on a surface of said chuck body between said baffle and said template, with said first and second apertures in fluid communication with said fluid supply system to produce a turbulent flow of said fluid between said mold and said substrate.

2. The system as recited in claim 1 wherein said chuck body further includes a plurality of apertures disposed on said surface of said chuck body between said baffle and said template.

3. The system as recited in claim 1 wherein said chuck body further includes first and second throughways, with said first and second throughways placing said first and second apertures, respectfully, in fluid communication with said fluid supply system.

4. The system as recited in claim 1 wherein said chuck body further includes a plurality of apertures disposed on said surface of said chuck body between said baffle and said template, with said plurality of apertures including a pair of apertures disposed opposite one another.

5. The system as recited in claim 1 wherein said chuck body further includes a plurality of apertures disposed on said surface of said chuck body between said baffle and said template, with said plurality of apertures lying in a common circle with adjacent apertures of said plurality of apertures being spaced-apart therefrom by 90°.

6. The system as recited in claim 1 wherein said chuck body further includes a plurality of apertures disposed on said surface of said chuck body between said baffle and said template, with said plurality of apertures lying in a common circle having a plurality of quadrants, with a quadrant of said plurality of quadrants comprising a set of apertures of said plurality of apertures, with differing quadrants of said plurality of quadrants comprising differing sets of apertures of said plurality of apertures.

7. The system as recited in claim 1 further including a processor in data communication with said fluid supply system, and a memory in data communication with said processor, said memory comprising a computer-readable medium having a computer-readable program embodied thereon, said computer-readable program including a set of instructions to control a second flow of said fluid between said fluid supply system and said first and second apertures.

8. The system as recited in claim 1 wherein said baffle further includes first and second opposed surfaces, with said first surface extending obliquely with respect to said second surface.

9. The system as recited in claim 1 wherein said baffle further includes first and second opposed surfaces, with said first surface extending parallel to said second surface.

10. A system for introducing a flow of a fluid between a mold, disposed on a template, and a substrate, said system comprising:
a fluid supply system; and
a chuck body having a baffle and a plurality of apertures, said plurality of apertures disposed on a surface of said chuck body between said baffle and said template, with said plurality of apertures in fluid communication with said fluid supply system to produce a turbulent flow of said fluid between said mold and said substrate.

11. The system as recited in claim 10 wherein said chuck body further a plurality of throughways, with said plurality of throughways placing said plurality of apertures in fluid communication with said fluid supply system.

12. The system as recited in claim 10 wherein said plurality of apertures further includes a pair of apertures disposed opposite one another.

13. The system as recited in claim 10 wherein said plurality of apertures lie in a common circle with adjacent apertures of said plurality of apertures being spaced-apart therefrom by 90°.

14. The system as recited in claim 10 said plurality of apertures lie in a common circle having a plurality of quadrants, with a quadrant of said plurality of quadrants comprising a set of apertures of said plurality of apertures, with differing quadrants of said plurality of quadrants comprising differing sets of apertures of said plurality of apertures.

15. The system as recited in claim 10 further including a processor in data communication with said fluid supply system, and a memory in data communication with said processor, said memory comprising a computer-readable medium having a computer-readable program embodied thereon, said computer-readable program including a set of instructions to control a second flow of said fluid between said fluid supply system and said plurality of apertures.

16. A system for introducing a flow of a fluid between a mold, disposed on a template, and a substrate, said system comprising:
a fluid supply system; and
a chuck body having a baffle and first and second throughways having first and second apertures disposed thereon, said first and second apertures disposed on a surface of said chuck body between said baffle and said template, with said first and second throughways placing said first and second apertures, respectfully, in fluid communication with said fluid supply system to produce a turbulent flow of said fluid between said mold and said substrate.

17. The system as recited in claim 16 wherein said chuck body further includes a plurality of apertures disposed on said surface of said chuck body between said baffle and said template.

18. The system as recited in claim 16 wherein said chuck body further includes a plurality of apertures disposed on said surface of said chuck body between said baffle and said template, with said plurality of apertures including a pair of apertures disposed opposite one another.

19. The system as recited in claim 16 wherein said chuck body further includes a plurality of apertures disposed on said surface of said chuck body between said baffle and said template, with said plurality of apertures lying in a common circle with adjacent apertures of said plurality of apertures being spaced-apart therefrom by 90°.

20. The system as recited in claim 16 wherein said chuck body further includes a plurality of apertures disposed on said surface of said chuck body between said baffle and said template, with said plurality of apertures lying in a common circle having a plurality of quadrants, with a quadrant of said plurality of quadrants comprising a set of apertures of said plurality of apertures, with differing quadrants of said plurality of quadrants comprising differing sets of apertures of said plurality of apertures.

21. A system comprising:
a nanolithography mold disposed on a template;
a substrate positioned a distance from said template;
a fluid supply system containing a fluid to be imprinted upon by said nanolithography mold when it is disposed between said mold and said substate; and
a chuck body having a baffle ring surrounding said template and first and second apertures, said first and second apertures disposed on a surface of said chuck body between said baffle and said template, with said first and second apertures in fluid communication with said fluid supply system and configured to produce a turbulent flow of said fluid between said nanolithography mold and said substrate.

22. The system as recited in claim 21 wherein said system is configured to produce said turbulent flow by pulsing said fluid through said first and second apertures.

23. The system as recited in claim 22 wherein said system is configured to pulse said fluid through said first and second apertures in an alternating manner.

24. The system as recited in claim 21 wherein said system is configured to produce said turbulent flow by pulsing said fluid through said first aperure and vacuuming said pulsed fluid through said second aperture.

25. The system as recited in claim 21 wherein said chuck body further includes a plurality of apertures disposed on said surface of said surface of said chuck body between said baffle and said template, with said plurality of apertures lying in a common circle having a plurality quadrants, with a quadrant of said plurality of quadrants comprising a set of apertures of said plurality of apertures, with differing quadrants of said plurality of quadrants comprising differing sets of apertures of said plurality of apertures.

26. The system as recited in claim 21 wherein said baffle further includes first and second opposed surfaces, with said first surface extending obliquely with respect to said second surface.

27. The system as recited in claim 26 wherein said baffle further includes first and second opposed surfaces, with said first surface extending parallel to said second surface.

* * * * *